United States Patent
Waldner

(10) Patent No.: US 7,215,273 B2
(45) Date of Patent: May 8, 2007

(54) METHOD AND DEVICE FOR RECONSTRUCTING AND CONTROLLING THE PHASE POSITION OF A SAMPLING CLOCK RELATIVE TO AN ANALOG SIGNAL TO BE SAMPLED

(75) Inventor: Markus Waldner, Klagenfurt (AT)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 11/142,833

(22) Filed: Jun. 1, 2005

(65) Prior Publication Data

US 2006/0023120 A1    Feb. 2, 2006

(30) Foreign Application Priority Data

Jun. 2, 2004    (DE)    ............... 10 2004 027 093

(51) Int. Cl.
*H03M 1/12*    (2006.01)
(52) U.S. Cl. ................................... 341/155
(58) Field of Classification Search ............ 341/155, 341/163, 122, 123, 124, 125, 118; 348/572, 348/573, 625, 607, 536, 537
See application file for complete search history.

(56) References Cited

U.S. PATENT DOCUMENTS 6,313,881 B1    11/2001    Reinhart et al. ............ 348/572
6,473,131 B1*   10/2002    Neugebauer et al. ........ 348/572
6,542,101 B1     4/2003    Kolsrud ...................... 341/155
2003/0185332 A1* 10/2003   Cheng ......................... 375/376
2005/0020228 A1*  1/2005   Yearim ........................ 455/260

FOREIGN PATENT DOCUMENTS

DE    102 54 469    6/2004

* cited by examiner

*Primary Examiner*—Brian Young
(74) *Attorney, Agent, or Firm*—O'Shea, Getz & Kosakowski, P.C.

(57) ABSTRACT

In a method and device for reconstructing and controlling the phase position of a sample clock relative to an analog signal to be sampled, the analog signal is sampled at a plurality of different instants in time during a time interval and a plurality of time gradients at the same or different instants in time are determined. The original analog signal is reconstructed, at least in segments, based on the sampled values and determined time gradients. The reconstructed signal curve is utilized to determine the phase position of the sampling clock relative to the analog signal. This phase position is provided to a control loop which readjusts the phase position of the sampling clock accordingly.

20 Claims, 8 Drawing Sheets

METHOD AND DEVICE FOR RECONSTRUCTING AND CONTROLLING THE PHASE POSITION OF A SAMPLING CLOCK RELATIVE TO AN ANALOG SIGNAL TO BE SAMPLED

PRIORITY INFORMATION

This application claims priority from German patent application 10 2004 027 093.7 filed Jun. 2, 2004, which is hereby incorporated by reference.

BACKGROUND OF THE INVENTION

The invention relates in general to video signal processing and in particular to a method and device by which the phase position of a sampling clock relative to an analog signal to be sampled can be reconstructed and controlled.

When analog signals, for example, analog video signals are processed or evaluated, these signals are often sampled in coupled form. Specifically in the case of analog video signals, line-coupled sampling is often implemented. This means that the analog signal is sampled at the sampling frequency (also called the pixel frequency) of the pixels to be displayed on the screen or monitor. A single pixel is typically sampled during a single sample period.

During the coupled sampling of analog signals, not only is the sampling or pixel frequency relevant, but also the phase position of the sampling clock relative to the analog signal to be sampled, for example, a pixel signal. For this reason, synchronization of the phase position of the sampling clock with the analog signal is generally desirable. In addition, it is desirable that the phase position of the sampling clock with respect to the analog signal be kept relatively constant.

If an unfavorable phase position occurs, as illustrated in the graph of FIG. 1a, then inaccurate sampling of the analog signal results. For example, the curve of an analog signal 10 illustrated in FIG. 1a carries the relevant information at alternating peak signal values W1 and W2. In video applications, for example, a black pixel could be associated with the peak signal value W1, while a white pixel could be associated with the peak signal value W2. In the example of FIG. 1a, the analog signal 10 is sampled during each of the time intervals Ta at corresponding sampling instants 12, at which the sampling values of the analog signal 10 illustrated by the points 14 are obtained. The time interval Ta represents the inverse of the sampling frequency.

For the phase position illustrated in the graph of FIG. 1a, the same sampling value 14 for each sampling instant 12 is obtained. A number of sampling results E are obtained which cannot be accurately associated with either of the peak sampling values W1 or W2. Relating this to the black and white pixel example, since the sampling results E lie in a straight line midway between the two signal values W1 and W2, a gray value results for each sampling value 14 which does not represent either a black or a white pixel. This situation is also illustrated in FIG. 1a by the sampling distance D being equal between W2 and E and between W1 and E. That is, there is zero separation distance between the sampling results E in FIG. 1a. As a result, any meaningful separation and interpretation of the peak sampling values W1 and W2 from the sampling results E are difficult to achieve.

Conversely, the graph in FIG. 1b illustrates the situation where the phase position for the sampling clock relative to the analog signal 10 results in the sampling values 14 differing by the highest possible distance D between the sampling results E1, E2. In other words, the analog signal 10 is sampled each time 14 at the peak values of W1 and W2. This yields both the sampling results E1, which are associated with the peak sampling value W1, and the sampling results E2, which are associated with the peak sampling value W2. Thus, as seen by the examples of FIGS. 1a and 1b, the phase position of the sampling clock relative to the analog signal 10 (i.e., the synchronization therebetween) is relevant as to the ability to properly evaluate and interpret the analog signal 10.

During analog video signal sampling, the required synchronization is often implemented by synchronizing a phase-locked loop (PLL), to control the phase position of the sampling clock, to a time synchronization pulse, also called an H-Sync, which pulse is normally transmitted in the analog video signals. However, in the case of computer video signals, the situation often arises whereby, for example, the pixels are shifted in phase relative to the H-Sync. As a result, additional phase correction of the sampling clock is required.

In the example above, however, as well as in general, the absolute value of the phase deviation of the analog signal from the sampling clock, or if present, the synchronization pulse, is in general not known since only one sampling point per to-be-sampled signal is available. Specifically, in the case of line-coupled sampling of an analog video signal, only one sampling value per pixel is normally available.

What is needed is a method and device by which the phase position of the sampling clock relative to the to-be-sampled signal can be simply and reliably determined and controlled.

SUMMARY OF THE INVENTION

In a method and device for reconstructing and controlling the phase position of a sample clock relative to an analog signal to be sampled, the analog signal is sampled at a plurality of different instants in time during a time interval and a plurality of time gradients at the same or different instants in time are determined. The original analog signal is reconstructed, at least in segments, based on the sampled values and determined time gradients. The reconstructed signal curve is utilized to determine the phase position of the sampling clock relative to the analog signal. This phase position is provided to a control loop which readjusts the phase position of the sampling clock accordingly.

The phase position of the sampling clock relative to the to-be-sampled signal can be determined relatively simply and reliably without the need for additional reference signals or without an increased burden on the device electronics. Independently of the analog signal, the phase position of the sampling clock can be determined with sufficient precision and tied in to a control loop. In addition, it is possible to implement a phase compensation, not only for static images but also for moving images Since any phase jump can be corrected relatively quickly, for example, within a line in the case of video signals, the evaluation or image remains sharp and high in contrast, and any phase jump would likely not be noticed by a viewer, for example, on a monitor.

These and other objects, features and advantages of the present invention will become more apparent in light of the following detailed description of preferred embodiments thereof, as illustrated in the accompanying drawings.

DETAILED DESCRIPTION OF THE INVENTION

Figure 1A:
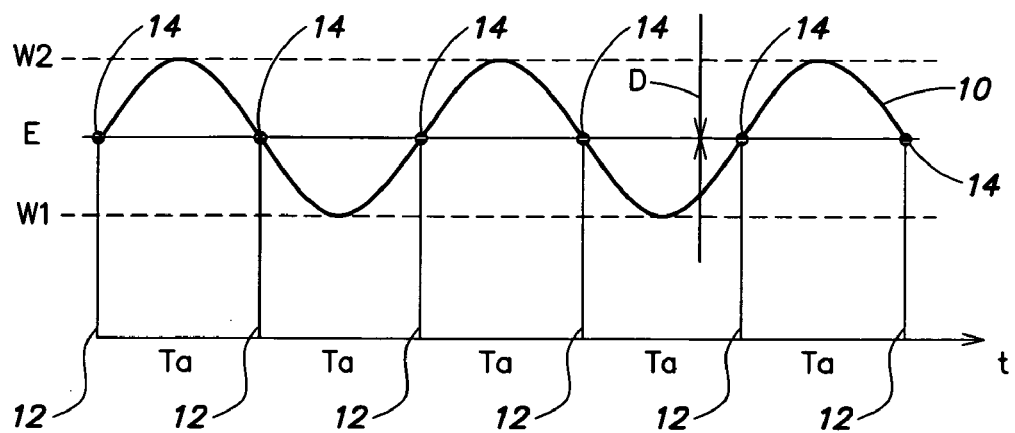
FIGS. 1a–1b are graphs that illustrate the known effects of the phase position of the sampling clock relative to the to-be-sampled analog signal on the quality of the sampling results.
Figure 1B:
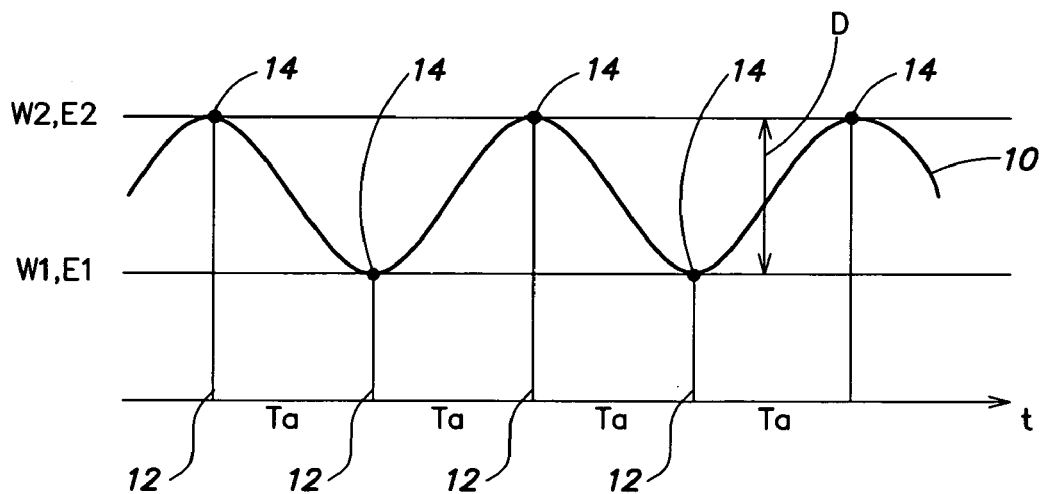
Figure 2A:
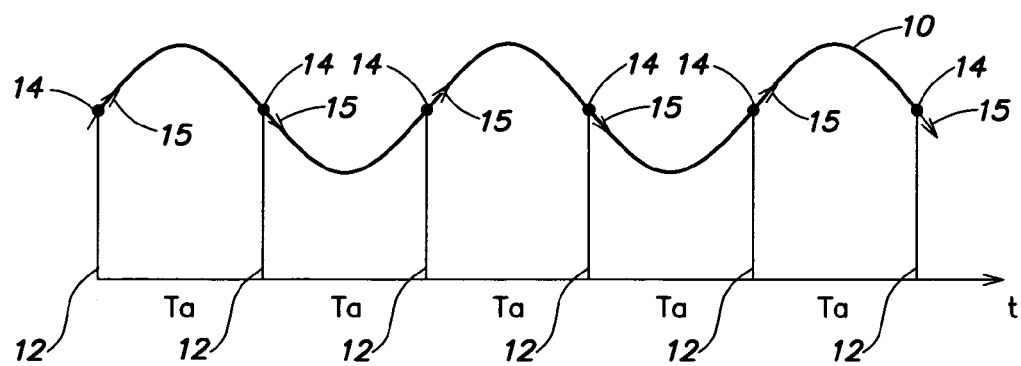
FIGS. 2a–2b are graphs that illustrate the effect of the phase position on the time gradients of the analog signal at the sampling instant.
Figure 2B:
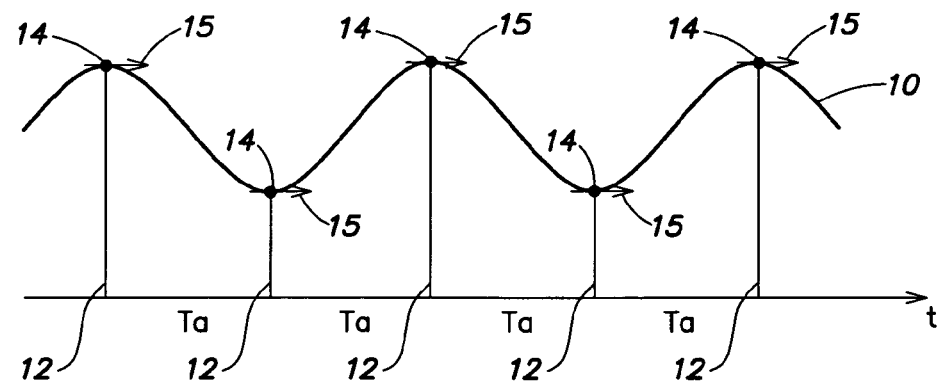

Referring to FIGS. 2a and 2b, an analog signal 10 is sampled, for example, at equidistant instants in time 12 during time intervals of sampling clock Ta which represents the inverse of the sampling frequency. However, continuous sampling at this frequency is not critical. It suffices that the analog signal 10 be sampled during any randomly chosen time interval at different instants in time, as long as the time position relative to each other is known. For example, sampling during the time interval may not be implemented at equal intervals.

In addition, at each sampling instant 12 at which a sampling value represented by a point 14 on the analog signal curve 10 is determined, the time gradient of the analog signal 10 present at this instant 12 is also determined. The gradient is indicated each time in FIGS. 2a–2b on the analog signal curve 10 by an arrow 15. The determination of the time gradients 15 at the same instants in time as the sampling instants is advantageous but not critical. It suffices that the time gradients 15 of the analog signal 10 are determined at different instants in time.

FIGS. 2a–2b illustrate the effect of the phase position on the time gradients 15 at the sampling instants 12. In the relatively unfavorable phase position for sampling the analog signal 10 illustrated in the graph of FIG. 2a, the gradients 15 at the sampling instants 12 assume their relatively largest values. In contrast, in the phase position at the sampling instants 12 illustrated in the graph of FIG. 2b, a time gradient 15 of zero is present. These facts related to the time gradients 15 can be utilized to determine the phase position of the sampling clock relative to the to-be-sampled analog signal 10. To accomplish this, however, knowledge of at least one segment of the time waveform or curve of the analog signal 10 is required. This may be obtained by approximate reconstruction of the signal curve of the analog signal 10 within at least one subrange of the region defined by the sampling values 14 and the determined gradients 15. To reconstruct the signal curve, use is made of at least some of the sampled values 14 of the analog signal 10 and at least some of the time gradients 15.

Reconstruction of the signal curve is based on selecting a mathematical function suitable for the analog signal curve 10, then determining its parameters by fitting this function to at least some of the sampling values 14 and time gradients 15. In doing so, a number of functions may be employed, for example, trigonometric functions or polynomial functions.

The approximate reconstruction of the analog signal curve 10 may be based, for example, on a fourth-order polynomial. The least-squares method may be used for the fitting procedure (i.e., determination of the five coefficients of the fourth-order polynomial). Other algorithms may also be employed.

Figure 3:
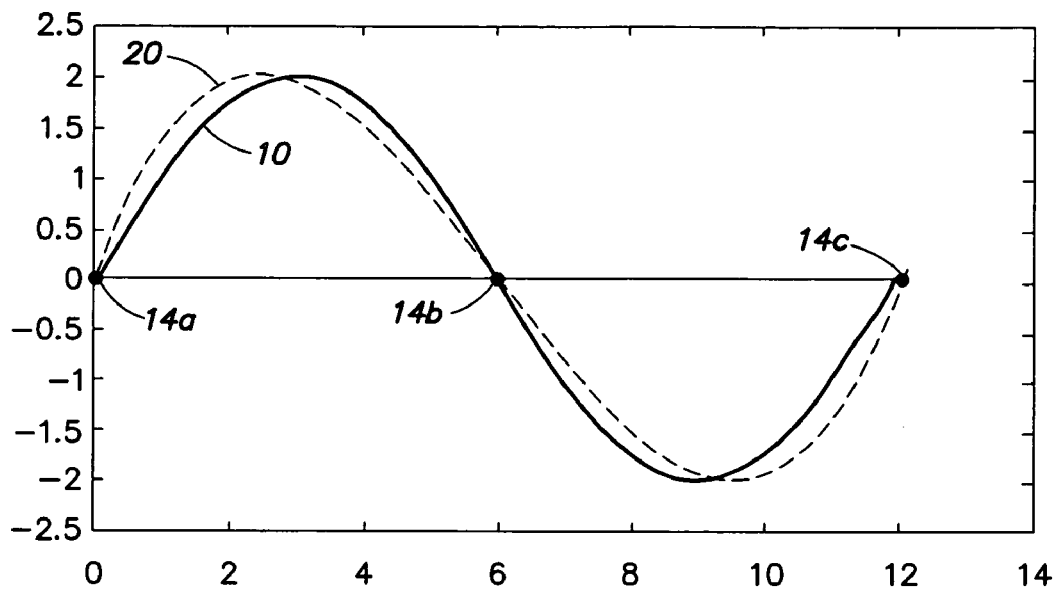
FIG. 3 is a graph that illustrates a sinusoidal segment of an analog signal, and a polynomial reconstruction of this segment given a relatively unfavorable phase position.
Figure 4:
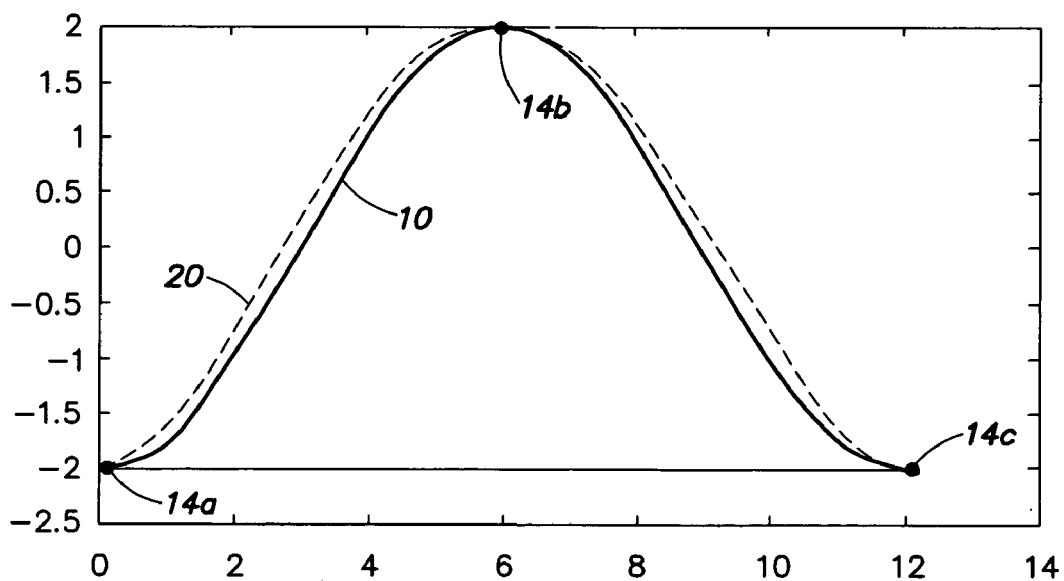
FIG. 4 is a graph that illustrates a sinusoidal segment of an analog signal and a polynomial reconstruction of this segment given a relatively favorable phase position.

The results of the reconstructions based on fourth-order polynomials and the least-squares method are illustrated in FIGS. 3 and 4 in which sinusoidal subregions of the analog signal curve 10 have been reconstructed. The subregion in which the reconstruction is performed is defined by three sampling values 14a, 14b, 14c, of the associated sampling instants. At these points, the time gradients are also determined. FIG. 3 illustrates the reconstruction of the analog signal curve 10 given the relatively unfavorable phase position of the sampling clock, while FIG. 4 illustrates the reconstruction of the analog signal curve 10 for the relatively favorable phase position of the sampling clock. As illustrated therein, the approximately reconstructed signal curve 20 in both FIGS. 3 and 4 reproduces the actual analog signal curve 10 with relatively adequate precision.

Figure 5:
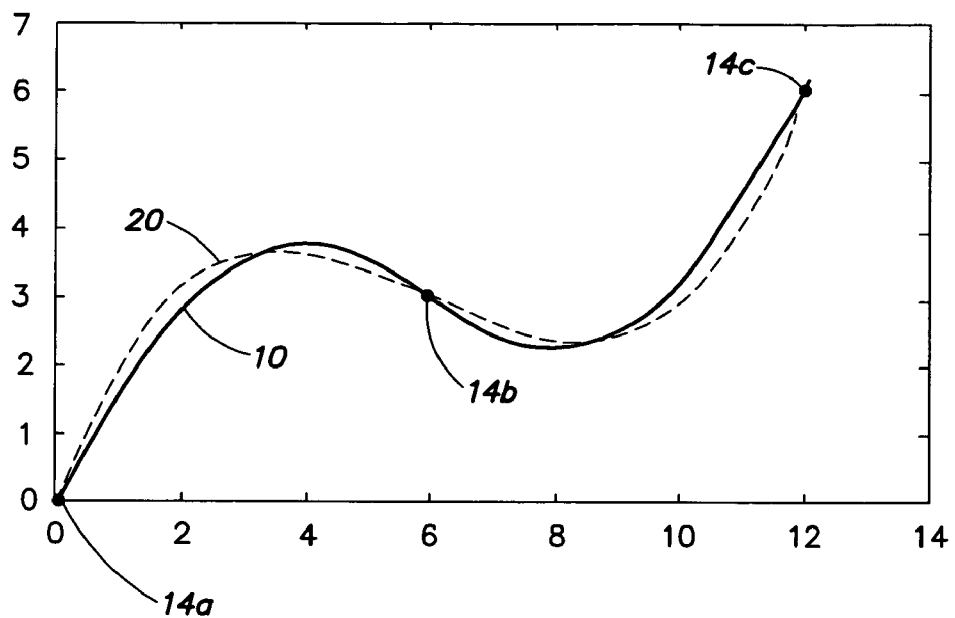
FIG. 5 is a graph that illustrates a segment of an analog signal and its reconstruction given a relatively unfavorable phase position.
Figure 6:
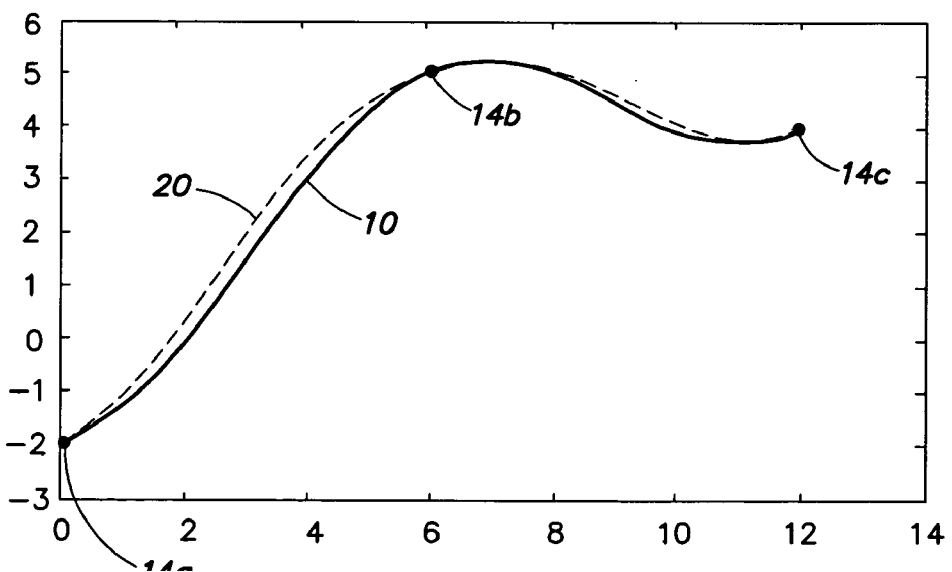
FIG. 6 is a graph that illustrates a segment of an analog signal and its reconstruction given a relatively more favorable phase position than that of FIG. 5.

As examples of non-sinusoidal signal curves of the analog signal 10, subregions of the analog signal 10 are illustrated in FIGS. 5 and 6. The regions illustrated may be reconstructed based on the sampling values 14a, 14b, 14c, and the time gradients present at these sampling instants using a fourth-order polynomial. The approximately reconstructed signal curve 20 is illustrated in both FIGS. 5 and 6. In FIG. 5, sampling of the analog signal 10 occurred at the relatively unfavorable phase position of the sampling clock, while in FIG. 6 sampling occurred at the relatively favorable phase position of the sampling clock. As evident in FIG. 5, the local extrema of the analog signal curve 10 and the approximately reconstructed signal curve 20 no longer coincide exactly. However, each time gradient may be determined at the respective sampling instant. As a result, for each control step in which the phase position is shifted towards a relatively more favorable phase position, the region with the relatively highest possible coincidence between the analog signal curve 10 and the approximately reconstructed signal curve 20 is shifted toward the local extrema. This is evident in FIG. 6 where the phase position closely approaches the relatively favorable phase position, while there is relatively good coincidence between the analog signal curve 10 and the reconstructed signal curve 20.

As mentioned hereinabove, a fourth-order polynomial may be utilized for reconstruction of the signal curve. Determination of the five coefficients of the polynomial requires the solution of a linear fifth-order equation system for these coefficients. As is well known, this equation system can be represented in matrix form. A step in solving this equation system comprises calculating the inverse matrix of the fifth-order equation system put into matrix form. The same number of sampling values 14 or time gradients may be utilized, which may also be identically spaced in time for the approximate reconstruction of the signal curve. This way, the inverse matrix may need to be calculated once and can be used for each reconstruction operation. Specifically, the coefficients of the inverse matrix can be stored at the start in a module to determine the phase position, with the result that there is no need to calculate the inverse matrix.

Figure 7:
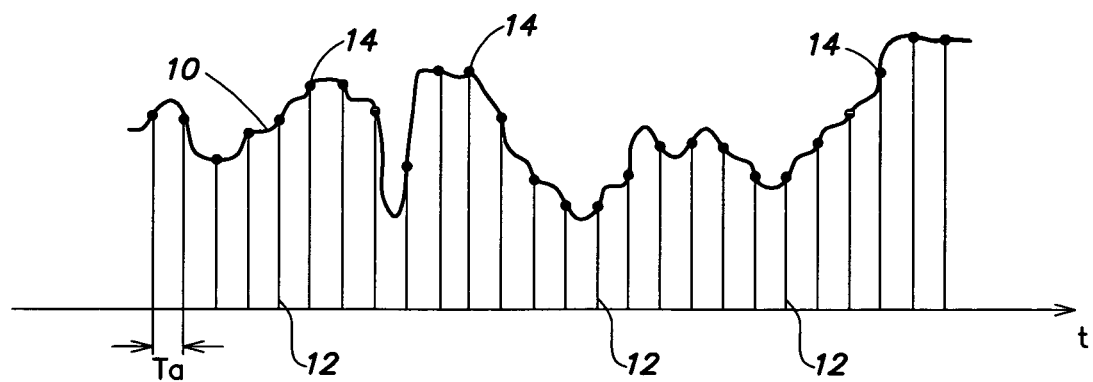
FIG. 7 is a graph that illustrates a relatively large nonperiodic segment of a to-be-sampled analog signal.
Figure 8:
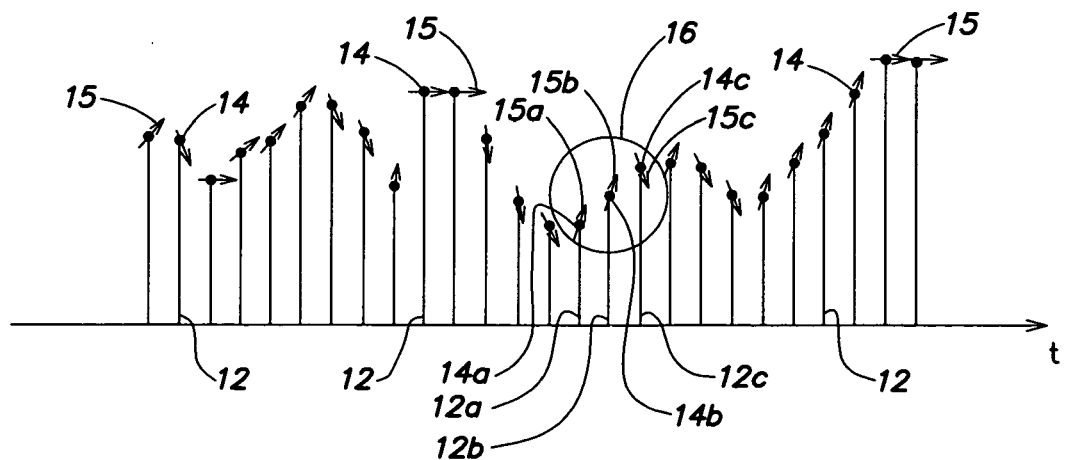
FIG. 8 is a graph that illustrates the discretization of the signal segment of the graph of FIG. 7 based on sampling values and time gradients present at the sampling instants.

Following the description above of the approximate reconstruction of the signal curve 20 for the analog signal 10, the following description explains in more detail the determination of the phase position as well as its control. FIG. 7 illustrates a subregion of the analog signal curve 10 which is being sampled at sampling clock rate Ta. For example, a 108 MHz data signal is sampled at a sampling frequency of 108 MHz, corresponding to a sampling clock Ta, and thus a period of 9.25 ns per sampling operation. Referring also to FIG. 8, the time gradients 15 are in turn determined at the corresponding sampling instants 12, thus producing the discretization of the analog signal curve 10. For the purpose of determining the phase position of the sampling clock relative to the analog signal 10, a circled region 16 in FIG. 8 includes the sampling instants 12a, 12b, 12c, along with corresponding sampling values 14a, 14b, 14c, this region 16 being shown in enlarged form in FIG. 9.

Figure 9:
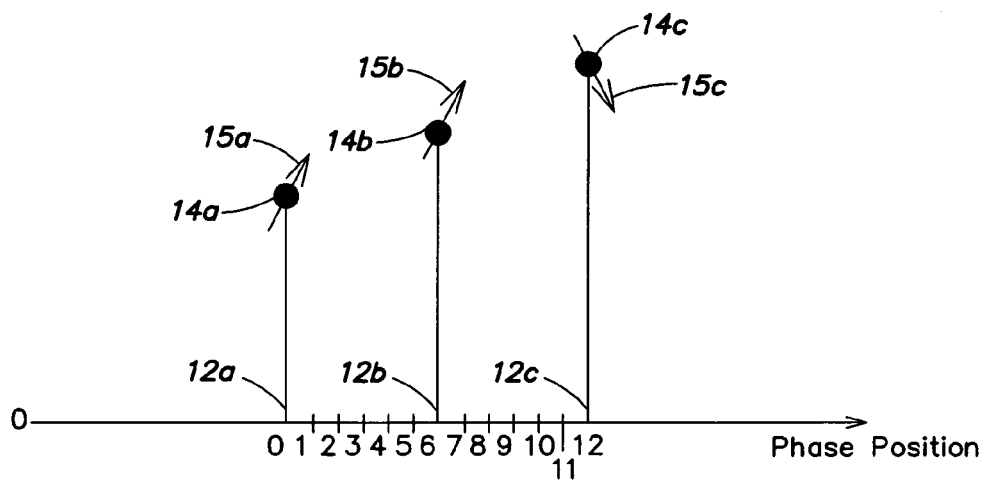
FIG. 9 is an enlargement of the circled area in the graph of FIG. 8.

With discretization of the analog signal curve 10, the horizontal time axis in FIG. 9 may no longer be interpreted as such but instead may be interpreted as the axis of the phase position. If in this example with a sampling frequency of 108 MHz it is assumed, for example, that the control circuit, or control loop to control the phase position, has a base clock of 648 MHz, then six phase positions can be adjusted per sampling clock Ta. Consequently, two sampling clocks Ta, at which three sampling values 14a, 14b, 14c are sampled, correspond to twelve phase positions, as indicated on the phase position axis in FIG. 9. Alternatively, the time axis can continue to be viewed as such, and the conversion of time information to phase position information can be implemented at a later time.

As described in detail hereinbefore with respect to FIGS. 3–7, the signal curve of the analog signal 10 may be reconstructed based on the sampling values 14a, 14b, 14c, and the associated time gradients 15a, 15b, 15c.

Figure 10:
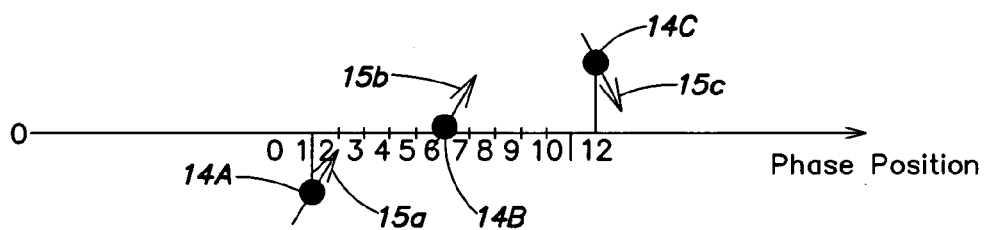
FIG. 10 illustrates a transformation of the values illustrated in FIG. 9 to a value range relatively more favorable for evaluation.

However, a transformation of the sampling values 14a–14c may first be implemented. The sampled values of the analog signal 10 may be transposed to a desired value range, which allows for relatively simpler and more precise calculation of the approximately reconstructed signal curve and of the phase position. This transformation may be implemented by addition of the negative value of the median of the sampling values, thus of the negative sampling value 14b in FIG. 9, to all of the sampling values 14a, 14b, 14c which are located in the subregion of the analog signal 10 utilized to reconstruct the signal curve. As a result, three new sampling values 14A, 14B, 14C are obtained, where the center sampling value 14B is ultimately located on the phase position axis in FIG. 10.

Figure 11:
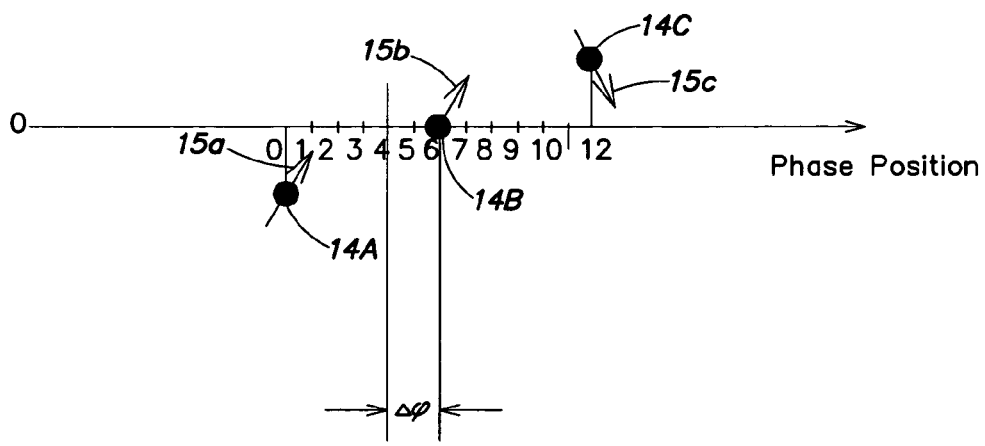
FIG. 11 illustrates the difference $\Delta\phi$ of the actual phase position relative to a favorable phase position with respect to the transformation illustrated in FIG. 11.

With the subsequent approximate reconstruction of the signal curve of the analog signal 10, not only is the reconstructed signal curve provided but also its time derivative. As described hereinabove with respect to FIG. 2, given a relatively favorable phase position of the sampling clock relative to the to-be-sampled analog signal 10, the sampling values 14 fall at local extrema of the signal curve of the analog signal 10, at which extrema the time gradient 15 of the signal curve of the analog signal 10 becomes zero. As a result, the distance of a sampling value 14A, 14B, 14C on the phase position axis from the nearest zero point of the time derivative of the reconstructed signal curve represents the phase difference $\Delta\phi$ for the phase position of the sampling clock from the relatively favorable phase position (FIG. 11). It is thus, first of all, the zero point of the first time derivative of the reconstructed signal closest to a sampling value or sampling instant which must be determined, followed by a determination of this point's distance on the phase position axis from the referenced sampling instant which represents the desired phase difference $\Delta\phi$ of the phase position of the sampling clock from the relatively favorable phase position. If there has been no re-interpretation, as described above, of the time axis to a phase position axis, then it would be necessary at this point to determine the time distance from this sampling instant of the determined zero point closest to a given sampling value or sampling instant, and then to convert this distance to a phase difference $\Delta\phi$ of the phase position of the sampling clock from the relatively favorable phase position.

In the example herein, it is the zero point of the first time derivative of the signal curve of the analog signal 10 closest to the center sampling value 14B that is determined. If the sampling value 14A or the value 14C were utilized instead, the closest zero point of the time derivative could lie outside the utilized value range, thereby possibly resulting in phase jumps in the control of the phase position which might cause the control to become unstable. For this reason, a determination is made of the closest zero point of that sampling value which lies chronologically between two additional sampling instants which in turn are part of the subregion of the analog signal 10 utilized for the approximate reconstruction of the signal curve of the analog signal 10.

The well-known Newton-Horner scheme may be employed to determine the zero point for the first time derivative of the signal curve of the analog signal 10 closest to the sampling value 14B, or the associated sampling instant 12b, whereby the sampling instant 12b of the examined sampling value 14B may be utilized as the initial value for the zero-point search. The Newton-Horner scheme converges on the zero point closest to the initial value.

Subsequently, the phase position of the sampling clock relative to the analog signal, or the phase difference of the sampling clock relative to the relatively favorable phase position, is determined based on the time distance of the determined zero point from the selected sampling value 14B, or that of the associated sampling instant 12b, and then supplied to a control circuit or control loop which readjusts the phase position such that the sampling instant 12b coincides to the relatively greatest extent possible with the time position of the determined zero point. Due to the limited number of adjustable phase positions (e.g., six phase positions having a base clock rate of 648 MHz) the adjustment to the relatively favorable phase position is not always possible since this position may not correspond exactly with one of the adjustable six phase positions. In this case, the control loop adjusts to that phase position which most closely approximates the relatively favorable phase position.

Figure 12:
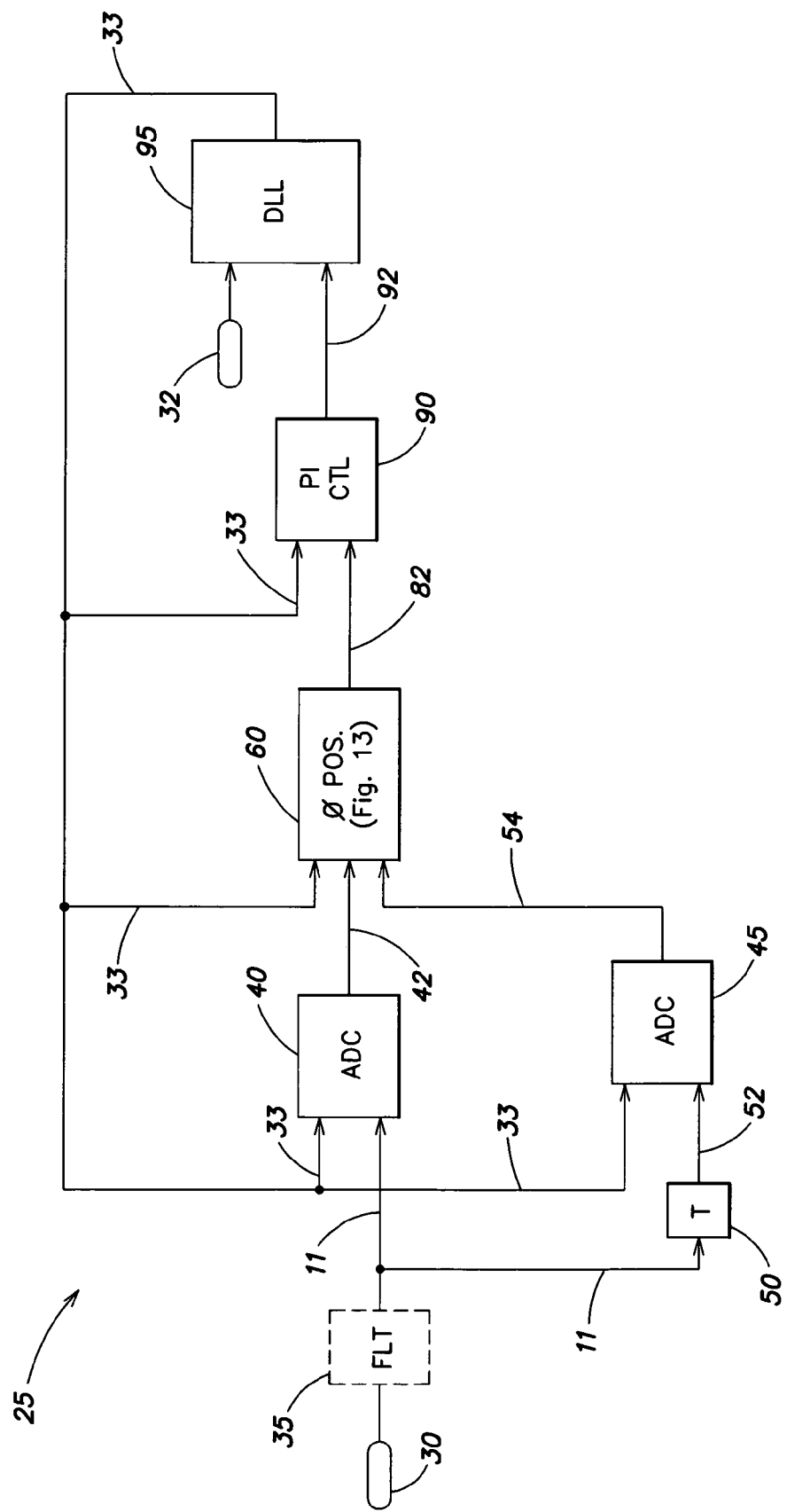
FIG. 12 is a block diagram of a device for reconstructing and controlling the phase position of a sampling clock relative to a to-be-sampled analog signal.

Referring to FIG. 12, there illustrated is a device 25 for reconstructing and controlling the phase position of a sampling clock relative to a to-be-sampled analog signal. An analog signal input 30 provides the analog signal on a line 11 both to a first analog-to-digital converter (ADC) 40 and to a time differentiation unit 50. The device 25 may also include a clock generator 32 which supplies the clock signal on a line 33 which may be modified as necessary by a phase-locked loop and supplied on the line 33 to the first ADC 40, a second ADC 45, and a module to determine the phase position 60.

Using the first ADC 40, the analog signal on the line 11 can be sampled at different time instants based on the clock signal on the line 33. The resulting sampling values of the analog signal 11 on a line 42 from the first ADC 40 can be supplied to the phase position module 60. After the analog signal on the line 11 has undergone time differentiation in the time differentiation unit 50, the time-differentiated analog signal on a line 52 can be supplied together with the clock signal on the line 33 to the second ADC 45. Due to the time coupling with the clock signal on the line 33, the second ADC 45 can sample the time-differentiated analog signal on the line 52 at the same instants as the first ADC 40. As a result, for each value of the analog signal on the line 11 sampled at a given time, the value of the time-differentiated signal on the line 52 associated with this instant can be sampled.

After the sampling of the time-differentiated analog signal on the line 52, the second ADC 45 provides the time gradients of the analog signal on a line 54 at the sampling instants to the phase position module 60. The phase position or phase difference relative to the relatively favorable phase position of the sampling clock relative to the signal curve of the analog signal on the line 11 can be determined within the module 60, which module 60 is explained in more detail with respect to FIG. 13. The calculated phase position or phase difference relative to the relatively favorable phase position on a line 82 is supplied to a proportional-integral controller (PI controller) 90, to which the clock signal on the line 33 is also applied. The PI controller 90 calculates the phase information for the control circuit or control loop and provides this information on a line 92 to a delay locked loop (DLL) 95. The PI controller 90 improves the system response in the event of phase jitter and phase jumps; however, the PI controller is not mandatory.

Through use of the DLL 95, the clock rate of the clock generator 32 can be modified based on the phase information on the line 92 such that the clock generator 32 and the DLL output a displaced clock on the 33 which in turn can be supplied to the other components 40, 45, 60, 90 as the clock signal 33. This enables an iterative control of the phase position of the sampling clock to be implemented-relative to the to-be-sampled analog signal on the line 11.

Figure 13:
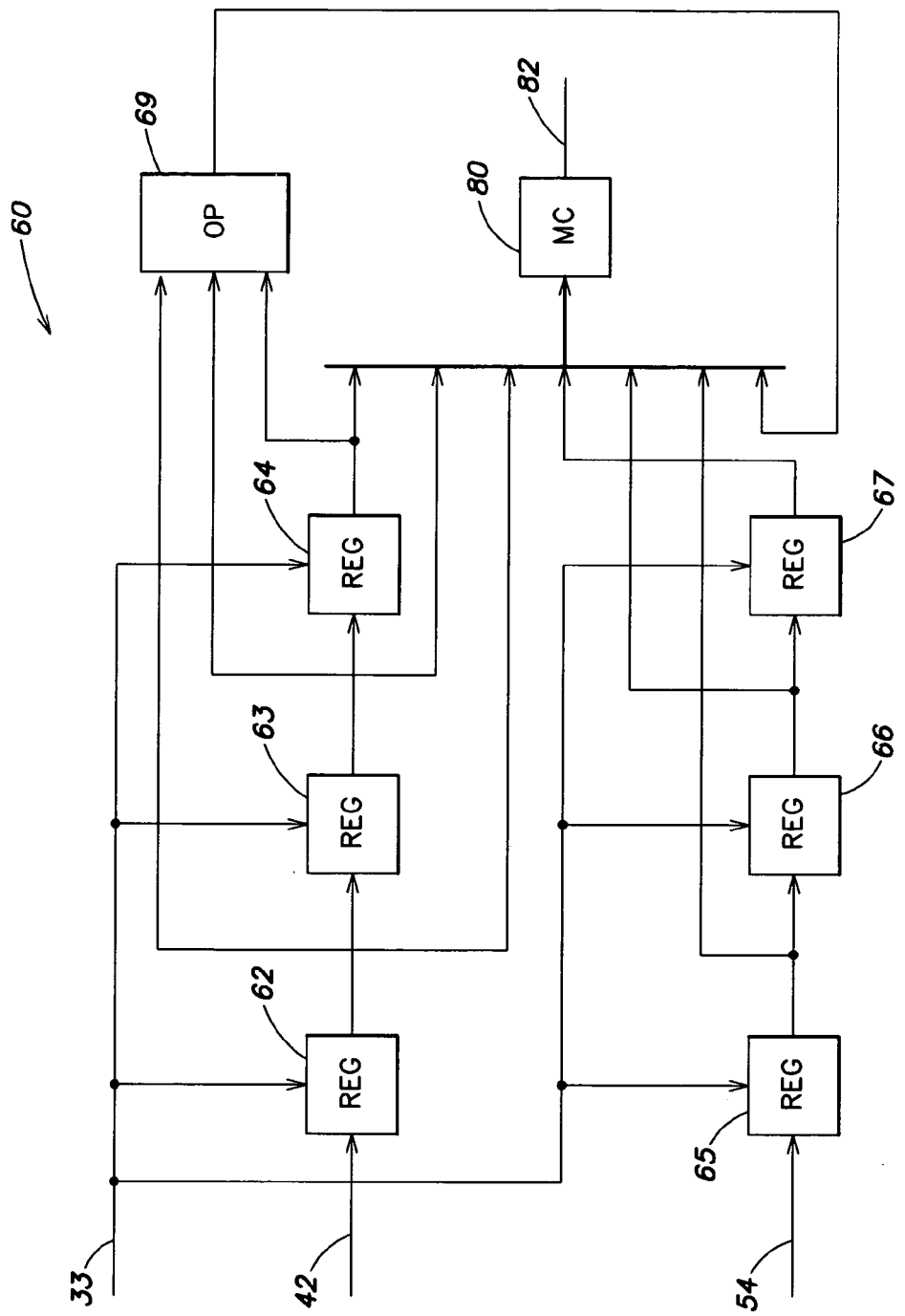
FIG. 13 is a block diagram of a portion of the device of FIG. 12 illustrating in detail the module for determining the phase position.

Referring to FIG. 13, there illustrated in more detail is the module to determine the phase position 60 of FIG. 12. In this module 60, a subregion of the region of the analog signal curve can be utilized for the approximate reconstruction of the signal curve. This region may be defined by the sampling values on the line 42 and by the time gradients on the line 54. At least some of the sampling values on the line 42 and at least some of the time gradients on the line 54 may be used.

A single storage register 62, 63, 64 may be provided for each sampling value of the analog signal on the line 42 utilized to reconstruct the signal curve. Also, a single storage register 65, 66, 67 may be provided for each time gradient utilized to reconstruct the signal curve. Reconstruction may be implemented using more than three sampling values of the analog signal on the line 42, and using more than three time gradients of the analog signal on the line 54, in which case a corresponding number of storage registers can be provided as necessary.

The storage registers 62, 63, 64 may be assignable with sampling values sampled at different instants. On the other hand, the time gradients of analog signal on the line 54 determined at different instants can be stored in the registers 65, 66, 67. In addition, the contents of the registers 62–67 can be supplied to a microcontroller 80 in which the segment-by-segment reconstruction of the analog signal curve can be implemented. In addition, the microcontroller 80 can also determine the zero point of the first time derivative of the reconstructed signal curve, and, as described hereinabove, can determine the phase position of the sampling clock relative to the analog curve based on the time distance of this sampling instant from the time position of the determined zero point, or, by using a phase position axis, based on the distance along the phase position axis of the sampling instant or sampling value from the determined zero point. The thus calculated phase position or phase difference relative to the relatively favorable phase position of the sampling clock on the line 82 is output from the module 60.

A median operator 69 may be utilized, by which the sampling values of the analog signal on the line 42 stored in the registers 62, 63, 64 can be related to the mean of these values, thereby effecting a transformation of the sampling values of the analog signal on the line 42 to the approximate zero value. This provides for a more precise calculation of the reconstructed signal curve.

It is not necessary to continually feed data to the device 25 to calculate the phase position. It is sufficient if, after termination of a calculation, the values for the next calculation are supplied to the microcontroller 80. Since a given phase change generally occurs very slowly, and rather infrequently, it is also possible to be limited to selective individual reconstruction operations (e.g., an operation at the center of a line of a video signal). In these cases, there would thus be a comparatively greater amount of time available for the calculation.

An uninterrupted evaluation of the sampling values on the line 42 or of the time gradients on the line 54 is thus not necessary. Calculation of the phase position of the sampling clock relative to the analog signal curve can be implemented at any desired instant. This aspect is attractive if there is a need to save on hardware or components.

In the event the frequency of the data signal is known and the signal is impaired by interference and/or noise at frequencies higher than the data signal frequency, the ability to filter out portions of the analog signal curve at frequencies higher than the data signal frequency may be provided, and to prevent these from influencing the determination and control of the phase position. This feature can be implemented by integrating an optional low-pass filter 35 after the analog signal input 30 in FIG. 12. This filter 35 may provide for relatively faster adjustment of the relatively favorable phase position of the sampling clock since it precludes temporary faulty control in the direction of local extrema of high-frequency interference. If the frequency of the data signal is variable within limits, then it is possible to employ the relatively highest occurring frequency as the cut-off frequency for the low-pass filter 35.

In those cases where a reconstructed signal curve of the analog signal on the line 10 with relatively high accuracy is not critical, it is also possible to utilize simplified gradients which provide information as to whether the signal curve at the sampling instant is rising, falling, or is flat. This is equivalent to a value range for these simplified gradients from one, zero, and one, or to analogous designations. Since a false gradient value in terms of absolute value has an effect only on the amplitude, this information is sufficient for the determination or control of the phase position of the sampling clock relative to a to-be-sampled analog signal.

Although the present invention has been illustrated and described with respect to several preferred embodiments thereof, various changes, omissions and additions to the form and detail thereof, may be made therein, with departing from the spirit and scope of the invention.

What is claimed is:

1. A method for reconstructing and controlling the phase position of a sampling clock relative to an analog signal to be sampled, comprising the steps of:
   sampling a plurality of values of the analog signal with the sampling clock at different instants in time;
   determining a plurality of time gradients of the analog signal at different instants in time;
   reconstructing a signal curve of the analog signal in at least one subregion of a region of the analog signal defined by the sampled values and the determined gradients through use of at least some of the sampled values and at least some of the determined time gradients;
   determining a zero point of a first time derivative of the reconstructed signal curve;
   determining a phase position of the sampling clock relative to the analog signal based on a time distance of one of the sampled values from the time position of the determined zero point; and
   supplying the determined phase position to a control loop that adjusts the phase position of the sampling clock relative to the analog signal based on the determined phase position.

2. The method of claim 1, where the steps of sampling a plurality of values and determining a plurality of time gradients occur at the same instants in time.

3. The method of claim 1, where the step of reconstructing a signal curve utilizes at least three sampled values and at least three time gradients.

4. The method of claim 1, where the step of reconstructing utilizes a polynomial.

5. The method of claim 1, where the step of determining a phase position of the sampling clock determines the phase position of the sampling clock based on the time distance of the sampled value that is closest in time to the time position of the determined zero point.

6. The method of claim 4, where the step of reconstructing a signal curve utilizes a fourth-order polynomial.

7. The method of claim 4, where the step of reconstructing a signal curve utilizes a least-squares method to determine coefficients of the polynomial.

8. The method of claim 1, further comprising the step of adding a predetermined value to each of a predetermined number of the sampled values.

9. The method of claim 1, where the step of determining a zero point utilizes a Newton-Homer technique.

10. A device for reconstructing and controlling a phase position of a sampling clock relative to an analog signal to be sampled, comprising:
    a clock generator that generates the sampling clock;
    a first analog-to-digital converter that samples values of the analog signal at different instants in time in response to the sampling clock;
    a device that time differentiates the analog signal and provides a time-differentiated analog signal;
    a second analog-to-digital converter that samples the time-differentiated analog signal at different instants in time in response to the sampling clock;
    a module that reconstructs a signal curve of the analog signal in at least one subregion of a region of the analog signal defined by the sampled values through use of at least some of the sampled values and at least some of the values of the time-differentiated analog signal and that determines a zero point of a first time derivative of the reconstructed signal curve, and that determines the phase position of the sampling clock relative to the analog signal based on a time distance of one of the sampled values from the time position of the determined zero point; and
    a control circuit that adjusts the phase position of the sampling clock relative to the analog signal based on the determined phase position.

11. The device of claim 10, where the module reconstructs a signal curve using at least three of the sampled values and at least three values of the time-differentiated analog signal.

12. The device of claim 10, further comprising one storage register each for each sampled value of the analog signal, and one storage register each for each value of the time-differentiated analog signal.

13. The device of claim 10, where the module further comprises a median operator that adds a predetermined value to each of a predetermined number of the sampled values.

14. The device of claim 10, where the module comprises a microcontroller.

15. The device of claim 10, where the control circuit comprises a delay locked loop.

16. The device of claim 10, where the control circuit comprises a proportional-integral controller.

17. A method for reconstructing and controlling the phase position of a sampling clock relative to an analog signal, comprising the steps of:
    sampling a plurality of values of the analog signal at different instants in time of the sampling clock;
    determining a plurality of time gradients of the analog signal at different instants in time of the sampling clock;
    reconstructing a signal curve of the analog signal in at least a portion of the analog signal through use of at least some of the sampled values and at least some of the determined time gradients;
    determining a zero point of a first time derivative of the reconstructed signal curve;
    determining a phase position of the sampling clock relative to the analog signal based on a time distance of a nearest one of the sampled values in time from the time position of the determined zero point; and
    supplying the determined phase position to a control loop that adjusts the phase position of the sampling clock relative to the analog signal based on the determined phase position.

18. The method of claim 17, where the steps of sampling a plurality of values and determining a plurality of time gradients occur at the same instants in time.

19. The method of claim 17, where the step of reconstructing uses at least three sampled values and at least three time gradients.

20. The method of claim 17, where the step of reconstructing uses a polynomial.

* * * * *

UNITED STATES PATENT AND TRADEMARK OFFICE
CERTIFICATE OF CORRECTION

PATENT NO. : 7,215,273 B2
APPLICATION NO. : 11/142833
DATED : May 8, 2007
INVENTOR(S) : Markus Waldner It is certified that error appears in the above-identified patent and that said Letters Patent is hereby corrected as shown below:

Column 5
line 32, before "corresponding" insert --the--

Column 6
line 45, delete "Homer" and insert --Horner--

Column 9
In the claims, claim 9, line 57, delete "Homer" and insert --Horner--

Signed and Sealed this

Nineteenth Day of June, 2007

JON W. DUDAS
*Director of the United States Patent and Trademark Office*